April 11, 1961 F. G. MASON 2,979,616

RADIO FREQUENCY TUNERS

Filed Aug. 20, 1957 2 Sheets-Sheet 1

INVENTOR.
Francis G. Mason
BY
Oona, McDougall, Williams & Hersh
Attorneys

April 11, 1961 F. G. MASON 2,979,616

RADIO FREQUENCY TUNERS

Filed Aug. 20, 1957

2 Sheets-Sheet 2

INVENTOR.
Francis G. Mason
BY
Oons, McDougall, Williams & Hersh
Attorneys

United States Patent Office 2,979,616

Patented Apr. 11, 1961

2,979,616

RADIO FREQUENCY TUNERS

Francis G. Mason, Weston, Conn., assignor to Aladdin Industries, Incorporated, Nashville, Tenn., a corporation of Illinois Filed Aug. 20, 1957, Ser. No. 679,172

13 Claims. (Cl. 250—40)

This invention relates to radio frequency tuners for use, for example, in television receivers or the like.

One object of the present invention is to provide a tuner having a new and improved cam drive which is arranged so as to be individually adjustable in each of the positions or channel settings of the tuner.

A further object is to provide a new and improved cam drive having an adjustable cam which provides its own detenting action to define the various positions of the cam.

Another object is to provide a new and improved cam drive having a cam which may be adjusted easily and accurately for each of the channel settings, yet is easy to manufacture and is low in cost.

A further object is to provide a tuner having new and improved means for moving a plurality of tuning sleeves along coils, while establishing circuit connections to the sleeves.

Another object is to provide a tuning element having new and improved means whereby a tuning sleeve is moved along a coil.

Further objects and advantages of the present invention will appear from the following description, taken with the accompanying drawings, in which.

Figure 1:
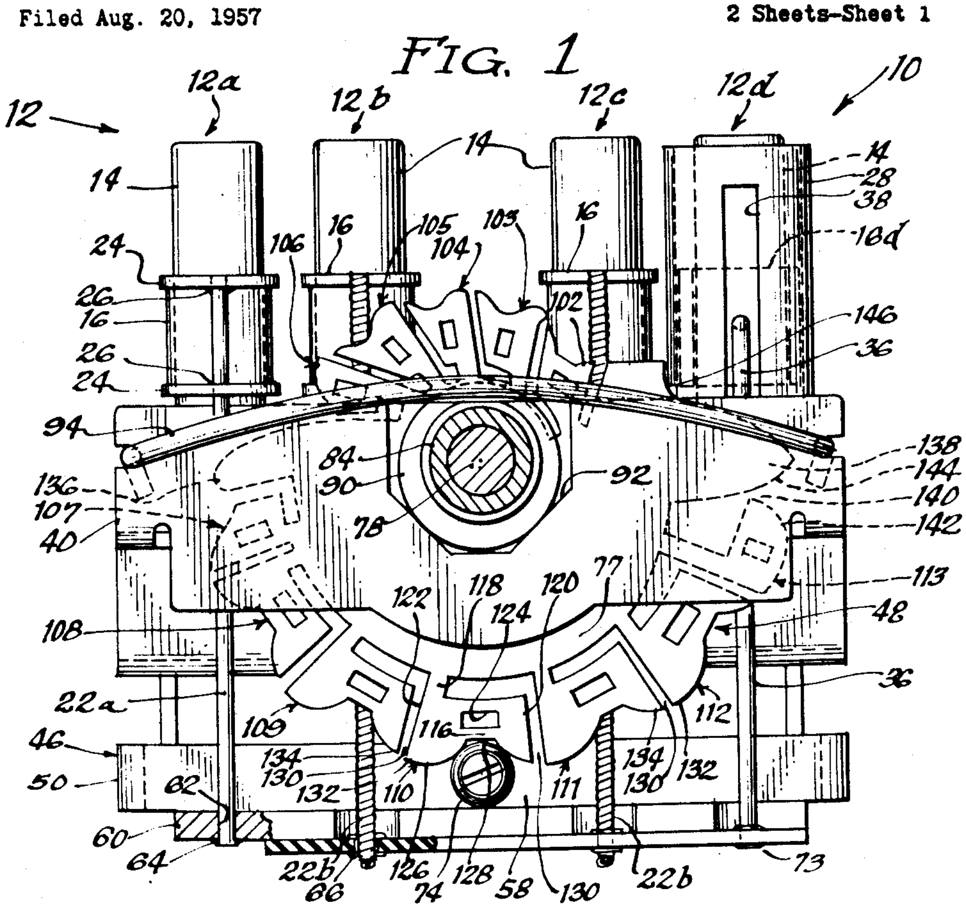
Fig. 1 is a front elevational view, partly in section, of a tuner to be described as an illustrative embodiment of the present invention.
Figure 5:
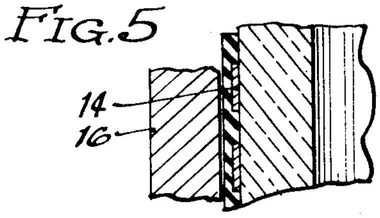
Fig. 5 is a greatly enlarged fragmentary longitudinal sectional view taken through a tuning element shown in Fig. 3.
Figure 6:
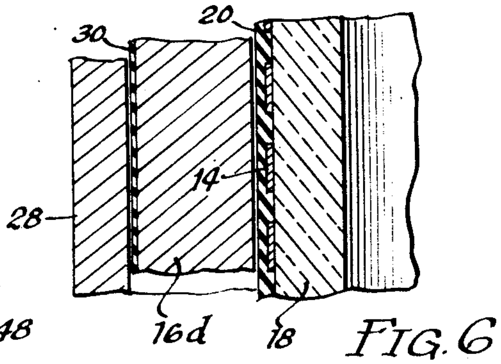
Fig. 6 is a greatly enlarged fragmentary longitudinal sectional view taken through a tuning element shown in Fig. 4.

As already indicated, Figs. 1–6 illustrate a radio frequency tuner 10 such as may be employed in connection with a radio or television receiver. While the tuner may be arranged to cover various frequency ranges, the illustrated tuner 10 is particularly adapted to cover the VHF (very high frequency) television band, comprising the commercial television channels numbered 2 through 13. This represents a frequency range from 54 to 216 megacycles.

The illustrated tuner 10 has a plurality of variable tuning elements collectively designated 12. Any number of variable tuning elements might be employed, but in this case there are four, individually designated as **12*a*, 12*b*, 12*c* and 12*d*. The tuning elements 12 are quite similar to one another, although not identical, as will be noted shortly. Each of the tuning elements 12 comprises an inductance coil 14 which is tuned by means of a sleeve or ring 16 adapted to slide along the outside of the coil. The sleeves 16 are the same for each of the first three tuning elements 12*a*, 12*b*, 12*c*, but the sleeve for the fourth tuning element 12*d* is somewhat different from the others, and hence will be designated 16*d***.

The coils 14 may be formed in various suitable ways, but each of the illustrated coils takes the form of a flat, generally helical conductive ribbon, of copper or other suitable material, supported on a cylindrical form 18. It is preferred to form the coil 14 on the form 18 by circuit printing methods. Such methods are known to those skilled in the art and need not be described. It is preferred to cover the coil 14 with a coating 20 of a dielectric material which affords electrical insulation and mechanical protection for the coil. The coating 20 may be made of an epoxy resin, or various other suitable materials. As illustrated, the width of the coil ribbon 14 varies along the length of the coil, to obtain a desirable tuning curve, but this is merely convenient and is not necessary to the present invention. The coil form 18 may be made of a suitable insulating material such as glass, plastics or the like. The coil ribbon 14 need be only a few thousandths of an inch thick and the coating 20 may also be quite thin.

Each of the rings or sleeves 16 may be formed to slide closely but easily along the corresponding coil 14. The rings 16 may be made of brass, copper or other suitable conductive material.

In the case of the tuning elements **12*a*, 12*b* and 12*c*, each element provides a two terminal tuned circuit, with the movable sleeve 16 as one terminal and one end of the coil 14 as the other terminal. Thus, a terminal lead 22 may be connected to the lower end of each coil 14. Circuit connections may be made to the sleeves 16 by means of flexible conductive rods 22*a* and 22*b* which also are employed to move the sleeves along the coils 14. The flexible rod for the first tuning element 12*a* is shown as a solid spring rod or wire, designated 22*a*, while the rods for the second and third tuning elements 12*b* and 12*c* are shown as being made of closely coiled wire, and thus are designated 22*b*. Either of these constructions may be employed for any of the rods. In this case, the rods 22*a* and 22*b* are soldered, welded or otherwise secured to flanges 24 which project outwardly from the sleeves 16 adjacent the upper and lower ends thereof. The solder or weld deposits are shown at 26**.

In the case of the fourth tuning element **12*d*, capacitive coupling is established to the sleeve 16*d* by an outer coupling sleeve 28, in which the sleeve 16*d* is received with a close but free sliding fit. In this case, the coupling sleeve 28 is sufficiently elongated to extend along substantially the entire length of the coil 14 for the tuning element 12*d*. To provide capacitive coupling between the sleeve 16*d* and the sleeve 28, a dielectric material is interposed between the sleeves. This dielectric material might be air, but is shown as an insulating coating 30. While the insulated coating 30 is applied to the outside of the sleeve 16*d*, it might be applied to the inside of the coupling sleeve 28**.

Thus the coil 14, the sleeve **16*d* and the coupling sleeve 28 for the fourth tuning element 12*d* form a two-terminal tuned circuit with the coupling sleeve 28 as one terminal and one end of the coil 14 as the other terminal. As in the case of the other tuning elements, a terminal lead 32 is connected to the lower end of the coil 14, but in this case a second terminal lead 34 is connected to the coupling sleeve 28**.

The sleeve **16*d* is adapted to be moved along the corresponding coil 14 by a flexible rod 36, which may be made of either conductive or insulating material. The illustrated rod 36 is connected to the outside of the tuning sleeve 16*d*** and is arranged to extend through an opening 38 in the coupling sleeve 28. As shown, the opening 38 takes the form of a longitudinal slot extending through the sleeve 28 for most of the length thereof.

For each of the tuning elements 12, the sleeve 16 is capacitively coupled to the portion of the coil 14 immediately within the sleeve. As the sleeve 16 is moved toward the lower end of the coil 14, the effective inductance between the sleeve and the lower end of the coil decreases. This variable inductance is resonated by the inherent or distributed capacitance of the coil, acting in conjunction with the capacitance between the sleeve and the coil, and any distributed or lumped capacitance that may be provided by any circuit connected to the coil. In the case of the tuning elements 12*a*, 12*b* and 12*c*, conductive connections are made to the sleeves 16 by way of the drive rods 22*a* and 22*b*. In the case of the fourth tuning element 12*d*, the sleeve 16*d* is coupled capacitively to the sleeve 28 to which circuit connections may be made.

The tuning elements 12 may be arranged in various circuits, and it will not be necessary to describe a specific circuit. However, it may be of interest to note that the first tuning element 12*a* may be employed in an antenna circuit, for coupling an antenna to the input of a radio frequency amplifier stage. The tuning elements 12*b* and 12*c* may be employed in an interstage coupling circuit to couple the output of the amplifier stage to the input of a superheterodyne mixer stage. The fourth tuning element 12*d* may be employed to tune a local superheterodyne oscillator. Arrangements of this sort are well-known to those skilled in the art. Thus, the tuning elements 12 are mounted on a metal chassis 40 which also supports tubes or other amplifying elements 42 and 44 for use in the radio frequency amplifier, mixer and oscillator.

All of the tuning elements 12 are ganged together for simultaneous operation. Thus, the operating rods 22*a*, 22*b* and 36 are connected to a swing frame or member 46 adapted to be operated by a cam 48. The swing frame 46 has arm portions 50 which are connected to the chassis 40 by pivots 52. In this case, the pivots 52 take the form of balls seated in openings 54 and 56 formed in the arms 50 and the chassis 40. A cross bar 58 extends between the arms 50.

In this case, the operating rod 22*a* for the first tuning element 12*a* is connected directly to a generally horizontal flange 60 formed on the cross bar 58. More specifically, the lower end of the flexible rod 22*a* is soldered, welded or otherwise secured in an opening 62 formed in the flange 60, the solder or weld deposits being indicated at 64. Thus, the sleeve 16 for the first tuning element 12*a* is conductively connected to the chassis 40 through the rod 22*a*, the swing frame 46, and the pivots 54.

It will be seen that the rods 22*b* for the second and third tuning elements 12*b* and 12*c* are soldered or otherwise secured in eyelets 66 mounted on an insulating plate or other member 68 secured to the flange 60. Circuit connections may be made to the rods 22*b* by means of flexible leads 70. One end of each lead 70 is soldered or otherwise connected to the lower end of the corresponding rod 22*b*. Each lead 70 extends along a path intersecting or closely approaching the axis of the pivots 54. The opposite ends of the leads 70 are connected to circuit terminals 72. The passage of the leads 70 along paths adjacent the axis of the pivots minimizes the extent to which the leads are flexed when the frame 46 is swung to vary the positions of the tuning sleeves 16.

In the illustrated arrangement, the flexible operating rod 36 for the fourth tuning element 12*d* is also secured to an eyelet 73 mounted on the insulating plate 68, but no circuit connection is made to the rod 36.

The cam 48 is actually engaged by a follower roller 74 which is rotatably mounted on the front portion of the swing frame 46. One or more suitable springs 76 are provided to bias the swing frame 46 upwardly so as to maintain the roller 74 in engagement with the cam 48.

The illustrated tuning cam 48 is in the form of a substantially flat plate having a body portion 77 which is secured to a horizontal tuning shaft 78. Front and rear bearings 80 and 82 are provided to support the shaft 78 for rotation. As disclosed and claimed in the copending application of Louis E. Coutermash, Serial No. 499,269, filed April 5, 1955, now Patent No. 2,872,824, the bearings 80 and 82 are arranged to shift the cam 48 bodily, in response to the rotation of a fine tuning shaft 84, so as to provide for fine adjustment of the tuning elements 12. Thus, the fine tuning shaft 84 is in the form of a sleeve which is rotatably received around the main tuning shaft 78. Coaxial knobs 86 and 88 may be provided to operate the shafts 78 and 84. In the illustrated construction, the outside of the fine tuning shaft 84 is coaxial with the outside of the main tuning shaft 78, but the rear end of the fine tuning shaft 84 is formed with an eccentric cam portion 90, which is received in a notch or slot 92 formed in the chassis 40. A wire bow spring 94 has its ends anchored to the chassis 40, while its mid portion is bowed upwardly over the fine tuning shaft 84, and forwardly in front of the enlarged cam portion 90 so as to urge the cam 90 downwardly into the notch 92, while urging the fine tuning shaft 84 rearwardly. The illustrated rear bearing 82 takes the form of a ball which is seated in openings 96 and 98 formed in the tuning shaft 78 and the chassis 40. The ball 82 and the openings 96 and 98 are disposed on the axis of the shaft 78. It will be seen from Fig. 3 that the rear end of the fine tuning shaft 84 engages the front end of a hub 100 secured to the tuning shaft 78. The hub 100 serves as a support for the cam 48. Thus, the bow spring 94 biases the main tuning shaft 78 rearwardly so as to prevent any play between the ball bearing 82 and the shaft.

When the fine tuning shaft 84 is rotated, the eccentric cam 90 shifts the main tuning shaft 78 about a small orbit, with the result that the shaft 78 and the cam 48 are moved upwardly and downwardly to a slight extent. This changes the positions of the tuning sleeves 16, with the result that the rotation of the shaft 84 effects fine tuning. The shaft 78 is also shifted laterally to a slight extent, but this has no substantial effect on the tuning.

The cam 48 is arranged so that it may be adjusted to provide precise tuning for each of the twelve television channels to be covered by the tuner. It will be realized, of course, that the coverage of twelve channels is merely by way of example, and that any suitable number of channels might be covered.

Thus, the illustrated cam 48 has twelve distinct, adjustable lobes, 102–113, corresponding to the television channels 2–13. All of the adjustable lobes 102–113 are much the same. In Fig. 1, the lobe 110 happens to be engaging the follower roller 74. This lobe 110 will be described in detail, and may be taken as typical of all of the lobes 102–113, except as otherwise noted.

Thus, each lobe, and particularly the lobe 110, is formed with a main or outer portion 116 which is adapted to be engaged by the follower roller 74 and is disposed outwardly of the supporting or body portion 77 of the cam 48. A narrow neck portion 118 extends in a generally radial direction between the main portion 116 of the lobe and the body portion 77 of the cam 48. The main portions 116 and the neck portions 118 of all of the lobes may be formed integrally with the illustrated cam 48, by stamping the cam from sheet metal. It will be seen that the main portion 116 is formed with opposite side edges 120 and 122, and that the neck portion 118 is adjacent the edge 122, but remote from the edge 120. Thus, the neck portion 118 is offset with respect to the main portion 116 of the lobe. In this way, the main portion 116 will be moved mostly in a radial direction if the neck portion 118 is bent. The angular position of the lobe about the shaft 78 will be changed very little by the bending of the neck portion 118. A slot 124 is formed in each lobe to receive a screw driver or other tool for use in bending the lobe so as to change its radial position and thereby secure exact tuning of the tuning elements 12.

The description offered thus far applies to all of the adjustable lobes 102–113. All of the lobes are also arranged to provide their own detenting action, so that the cooperation between the lobes and the follower roller 74 will detain the cam accurately in all of its channel settings. The detaining action of the lobes 102—105 and 108—112 is essentially the same and will be described with relation to the lobe 110, but the detaining action of the lobes 106, 107 and 113 is somewhat different and will be described separately.

Thus, the lobe 110 has a peripheral portion 126 which is formed with a fairly deep detent notch 128 adapted to receive the roller 74 so that the roller will detain the cam 48 in the channel seating corresponding to the particular lobe. There are spaces 130 between the lobe 110 and the adjacent lobes 109 and 111, but the spaces 130 are made as narrow as possible so as to minimize any tendency for the roller to enter the spaces. The spaces 130 are considerably narrower than the detent notches 128. Moreover, the adjacent lobes are arranged with outer edge portions 132 and 134, on opposite sides of the spaces 130, which approach the spaces with the same angle of inclination so that the roller 74 will pass smoothly over the spaces 130. Thus, the edge portion 132 slants downwardly toward the space 130, while the edge portion 134 slants downwardly at substantially the same angle away from the space 130. The slant is sufficient to prevent the roller 74 from being detained in the space 130.

In the case of the lobes 106, 107 and 113, the roller 74 is detained between the lobe and an adjacent lobe of the cam 48. In this case, such adjacent lobes take the form of fixed or non-adjustable lobes 136 and 138 on the cam 48. The fixed lobe 136 is positioned between the lobes 106 and 107 and thus cooperates with both of these lobes in providing detenting action. The lobe 113 may be taken as typical of the lobes 106—107 and 113, and the following description with respect to the lobe 113 will suffice with regard to all three of these lobes. Thus, a space or slot 140 is formed between the lobe 113 and the fixed cam lobe 138. The lobe 113 has a peripheral portion 142 which slopes downwardly at a fairly sharp angle into the space 140. On the opposite side of the space 140 the fixed lobe 138 has a cooperate peripheral portion 144 which also slopes downwardly into the space. Thus, the sloping portions 142 and 144 combine with the space 144 to form a detent notch adapted to receive the roller 74.

Between the fixed lobe 138 and the lobe 102, the cam 48 has a detent notch 146 which provides an additional setting of the cam for use when the tuner is to be employed in connection with an ultra high frequency converter, for tuning the ultra high frequency television band.

Figure 7:
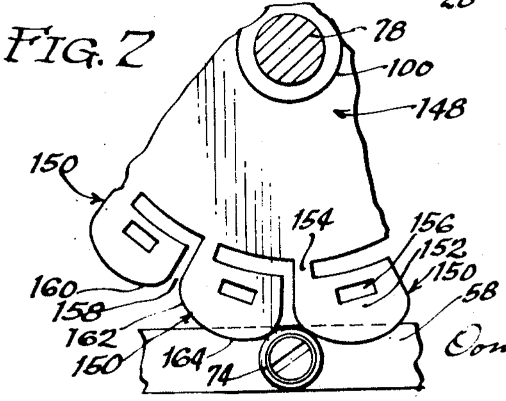
Fig. 7 is a view similar to Fig. 1, but showing a modified adjustable tuning cam.
Figure 2:
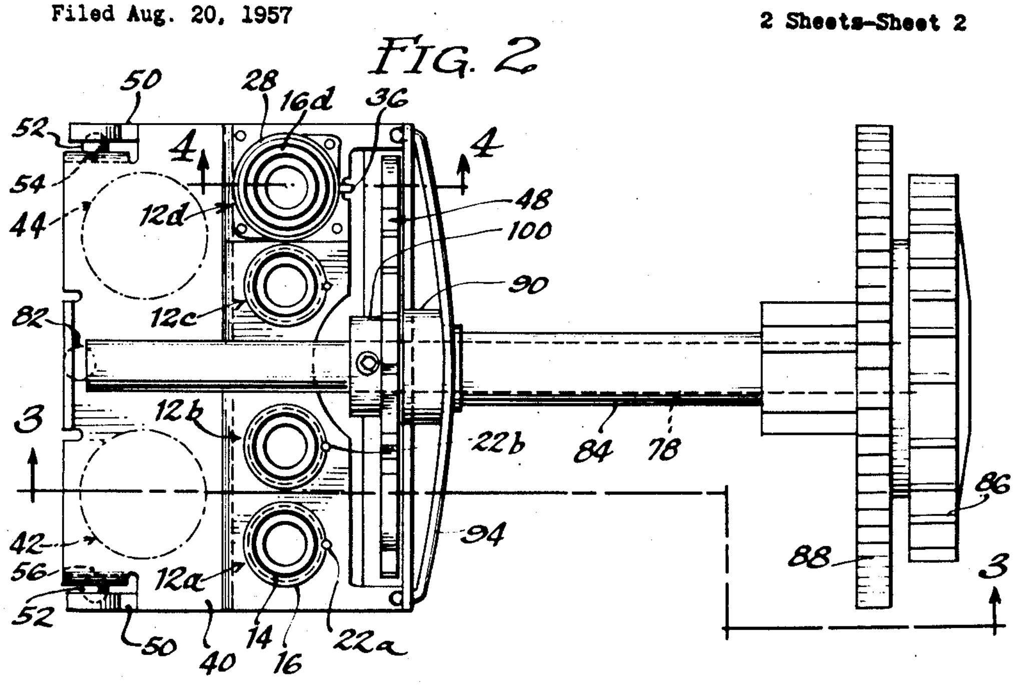
Fig. 2 is a top plan view of the tuner of Fig. 1.
Figure 3:
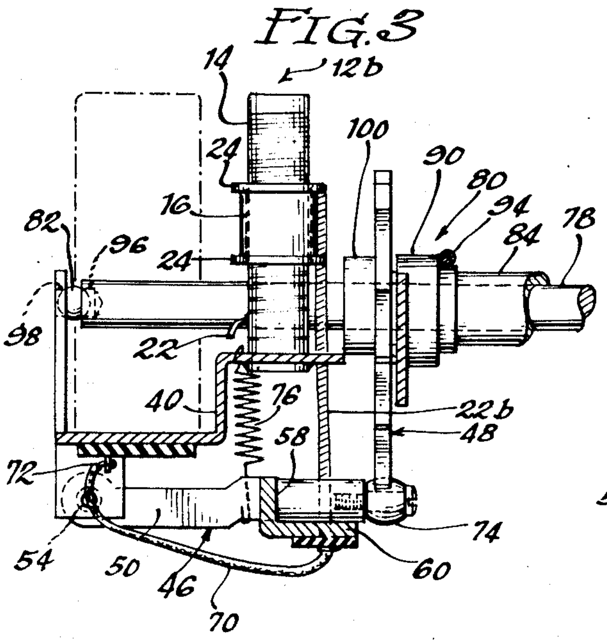
Fig. 3 is an elevational sectional view, taken generally along the line 3—3 in Fig. 2.
Figure 4:
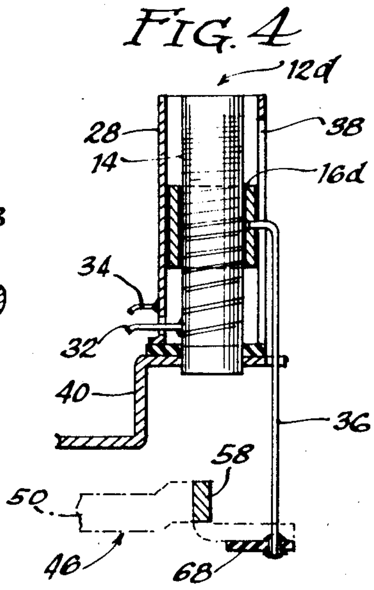
Fig. 4 is a fragmentary elevational sectional view taken generally along the line 4—4 in Fig. 2.

Fig. 7 illustrates a modified cam 148 which may be the same as the cam 48, except that the cam 148 has adjustable lobes 150, all of which are similar in construction to the lobe 113 of the cam 48. Thus, each of the lobes 150 has a main or outer portion 152 and an offset neck portion 154, as in the case of the cam 48. A tool receiving slot 156 is formed in the main portion 152. Spaces 158 are formed between the lobes 150. On opposite sides of each space 158, the adjacent lobes 150 have peripheral portions 160 and 162 which slant into the space so as to combine with the space to form a detent notch. The peripheral portion 160 of each lobe 150 is remote from the neck portion 154, while the peripheral portion 162 is relatively near the neck portion. Thus, the roller 74 engages one of the adjacent lobes at a point remote from the neck portion so that the position of the roller will be affected to a maximum extent by bending the neck portion. The roller engages the other of the adjacent lobes at a point near the neck portion so that the roller will be affected very little by bending this neck portion. This arrangement obviates any objectionable interdependence between the adjustments of the adjacent lobes. Between the opposite peripheral portions 160 and 162 on each lobe 150, the lobe has an outwardly arching portion 164 over which the roller 74 is adapted to pass without any detaining action.

In the operation of the main embodiment of Figs. 1–6, the tuner is adjusted to the various television channels by rotating the main tuning shaft 78 so as to bring each of the adjustable lobes 102–113 in succession into engagement with the cam follower roller 74. Each lobe provides its own detaining action, as just explained. Any channel may be adjusted individually by setting the tuner to that channel, inserting a screw driver or other tool into the slot 124 and bending the lobe in the plane of the cam 48 so as to shift the radial position of the lobe. This will change the position of the roller 74 and thereby shift the tuning sleeves 16. For a small range of fine tuning at any channel, the fine tuning shaft 84 may be rotated so that the eccentric cam 90 will bring about a bodily shifting movement of the shaft 78 and the cam 48.

The action of the cam 48 on the roller 74 swings the frame 46 about its pivots 54. The flexible rods 22*a*, 22*b* and 36 transmit the vertical movement of the frame 46 to the tuning sleeves 16, so as to slide the sleeves along the coil 14. This varies the inductance between the lower end of each coil and the corresponding sleeve 16.

It will be apparent that the adjustment of the cam 48 for each channel is easily accomplished. Nevertheless, the adjustable cam may be manufactured very easily and at low cost.

Various modifications, alternative constructions and equivalents may be employed without departing from the true spirit and scope of the invention as exemplified in the foregoing description and defined in the following claims.

I claim:

1. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions extending between said lobes and said body portion and being bendable for adjusting the radial extent of said lobes, each of said arm portions being integral with and connected between said body portion and one side edge of the corresponding lobe, said arm portions thereby being in offset relation to said lobes, said lobes having peripheral portions defining detent notches for receiving said cam follower and detaining said cam with said cam follower engaging each of said lobes.

2. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions extending between said lobes and said body portion and being bendable for adjusting the radial extent of said lobes, each of said arm portions being integral with and connected between said body portion and one side edge of the corresponding lobe, said arm portions thereby being in offset relation to said lobes, each of said lobes having a peripheral portion with a detent notch formed therein for receiving said cam follower and thereby detaining said cam in successive positions with said follower engaging each of said lobes.

3. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions extending between said lobes and said body portion and being bendable for adjusting the radial extent of said lobes, each of said arm portions being integral with and connected between said body portion and one side edge of the corresponding lobe, said arm portions thereby being in offset relation to said lobes, said lobes having spaces therebetween, each of said lobes and the adjacent lobe having inwardly inclined peripheral portions on opposite sides of the space therebetween to define a detent notch for receiving said cam follower and thereby detaining said cam with said follower engaging each of said lobes at a point remote from said neck portion on one of said adjacent lobes, but near said neck portion on the other of said adjacent lobes.

4. In a radio frequency tuner, the combination comprising a movable tuning element, a cam follower roller connected to said element, a rotatable tuning shaft, a tuning cam secured to said shaft, and a spring biasing said roller against said cam, said cam comprising a substantially flat plate having a body portion secured to said shaft, a plurality of distinct lobes disposed outwardly of said body portion and engageable with said roller, said plate being substantially perpendicular to the axis of said shaft, each of said lobes being integral and co-planar with said body portion but spaced outwardly therefrom with a slot therebetween and a plurality of narrow arm portions extending between said lobes and said body portion, each of said arm portions being integral with and disposed between said body portion and one side edge of the corresponding lobe, said arm portions being bendable in the plane of said plate for adjusting the radial extent of said lobes, each of said lobes having a tool receiving slot therein for use in bending said lobe, said lobes having portions defining detent notches for receiving said roller and detaining said cam with said roller engaging each of said lobes in succession.

5. In a radio frequency tuner, the combination comprising a movable tuning element, a cam follower roller connected to said element, a rotatable tuning shaft, a tuning cam secured to said shaft, and a spring biasing said roller against said cam, said cam comprising a substantially flat plate having a body portion secured to said shaft, a plurality of distinct lobes disposed outwardly of said body portion and engageable with said roller, said plate being substantially perpendicular to the axis of said shaft, each of said lobes being integral and co-planar with said body portion but spaced outwardly therefrom with a slot therebetween and a plurality of narrow arm portions extending between said lobes and said body portion, each of said arm portions being integral with and disposed between said body portion and one side edge of the corresponding lobe, said arm portions being bendable in the plane of said plate for adjusting the radial extent of said lobes, each of said lobes having a tool receiving slot therein for use in bending said lobe, each of said lobes having opposite side edges with a peripheral portion extending therebetween and a detent notch formed in said peripheral portion for receiving said roller, said notches detaining said cam with said roller engaging each of said lobes in succession.

6. In a radio frequency tuner, the combination comprising a movable tuning element, a cam follower roller connected to said element, a rotatable tuning shaft, a tuning cam secured to said shaft, and a spring biasing said roller against said cam, said cam comprising a substantially flat plate having a body portion secured to said shaft, a plurality of distinct lobes disposed outwardly of said body portion and engageable with said roller, said plate being substantially perpendicular to the axis of said shaft, each of said lobes being integral and co-planar with said body portion but spaced outwardly therefrom with a slot therebetween and a plurality of narrow arm portions extending between said lobes and said body portion, each of said arm portions being integral with and disposed between said body portion and one side edge of the corresponding lobe, said arm portions being bendable in the plane of said plate for adjusting the radial extent of said lobes, each of said lobes having a tool receiving slot therein for use in bending said lobe, each of said lobes having a side edge remote from the corresponding neck portion and a side edge near said neck portion, said lobes having spaces therebetween, each of said lobes and the adjacent lobe having peripheral portions angling inwardly on opposite sides of the spaces therebetween to define a detent notch for receiving said roller to detain said cam with said roller engaging each of said lobes in succession adjacent said remote edge thereof.

7. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions integral with and extending between said lobes and said body portion and being bendable for adjusting the radial extent of said lobes, at least some of said lobes having peripheral portions defining detent notches for receiving said cam follower and detaining said cam.

8. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions integral with and extending between said lobes and said body portion and being bendable for adjusting the radial extent of said lobes, at least some of said lobes having peripheral portions with detent notches formed therein for receiving said cam follower and thereby detaining said cam.

9. In a tuner, the combination comprising a movable tuning element, a cam follower connected to said element, a rotatable tuning shaft, a tuning cam secured to said shaft, and means resiliently biasing said follower against said cam, said cam comprising a substantially flat plate having a body portion secured to said shaft, a plurality of distinct lobes engageable with said cam follower, said plate being substantially perpendicular to the axis of said shaft, each of said lobes being integral and co-planar with said body portion but spaced outwardly therefrom with a slot therebetween and a plurality of narrow arm portions integral with and extending between said lobes and said body portion and being bendable for adjusting the radial extent of said lobes, said lobes having spaces therebetween, at least some of said lobes and the adjacent lobes having inwardly inclined peripheral portions on opposite sides of the spaces therebetween to define detent notches for receiving said cam follower and thereby detaining said cam.

10. In a tuner, the combination comprising a plurality of coils, each of said coils having a conductive tuning ring slidable in a substantially straight line along the outside thereof with insulating means between said ring and said coil to provide for capacitive energy exchange therebetween, means for effecting a circuit connection to one end of each of said coils, a swing frame having pivot means supporting said frame for swinging movement toward and away from said coils in a direction generally parallel to the axes of said coils, a plurality of flexible conductive rods connected between said frame and said respective tuning rings for operating said rings and effecting circuit connections thereto, each of said rods having a rigid connection to the corresponding ring and being secured to said swing frame for movement therewith, a cam for swinging said frame to move said rings along said coils, and a main frame having means thereon supporting said coils and said pivot means, at least one of said rods having a flexible lead connected thereto and extending between said swing frame and said main frame along a path closely adjacent the axis of said pivot means.

11. In a tuner, the combination comprising a plurality of tuning devices having respective movable conductive tuning elements constituting terminals of said devices, said elements being movable along substantially straight generally parallel paths, a main frame having means thereon supporting said devices, a swing frame having pivot means supporting said swing frame on said main frame for swinging movement in a direction corresponding generally to the direction of movement of said tuning elements, and a plurality of flexible conductive rods connected between said swing frame and said respective tuning elements, each of said rods having a rigid connection to the corresponding tuning element and being secured to said swing frame for movement therewith, at least one of said rods having a flexible lead connected thereto and extending between said swing frame and said main frame along a path adjacent the axis of said pivot means.

12. In a tuner, the combination comprising a coil having a conductive tuning ring slidable in a substantially straight line along the outside thereof with insulating means between said ring and said coil to provide for capacitive energy exchange therebetween, a swing frame having pivot means supporting said frame for swinging movement toward and away from said coil in a direction generally parallel to the axes of said coil, a flexible conductive rod connected between said frame and said tuning ring for operating said ring and effecting a circuit connection thereto, each of said rods having a rigid connection to the corresponding ring and being secured to said swing frame for movement therewith, means for swinging said frame to move said ring along said coil, and a main frame having means thereon supporting said coil and said pivot means.

13. In a tuner, the combination comprising a tuning device having a movable conductive tuning element constituting a terminal of said device, said device having means supporting said tuning element for substantially straight line movement, a main frame having means thereon supporting said device, a swing frame having pivot means supporting said swing frame on said main frame for swinging movement in a direction corresponding generally to the direction of movement of said tuning element, and a flexible conductive rod connected between said swing frame and said tuning element, each of said rods having a rigid connection to the corresponding tuning element and being secured to said swing frame for movement therewith, said rod having a flexible lead connected thereto and extending between said swing frame and said main frame along a path adjacent the axis of said pivot means.

References Cited in the file of this patent

UNITED STATES PATENTS

| | | |
|---|---|---|
| 2,163,864 | Bissell | June 27, 1939 |
| 2,250,366 | Frisbee | July 22, 1941 |
| 2,505,791 | Rennick | May 2, 1950 |
| 2,533,810 | Jacob et al. | Dec. 12, 1950 |
| 2,788,447 | Johnson | Apr. 9, 1957 |
| 2,872,824 | Coutermash | Feb. 10, 1959 |
| 2,873,373 | Lyman | Feb. 10, 1959 |
| 2,913,681 | Lyman | Nov. 17, 1959 |
| 2,938,392 | Lyman | May 31, 1960 |

FOREIGN PATENTS

| | | |
|---|---|---|
| 432,456 | Italy | Mar. 20, 1948 |